United States Patent
Huang et al.

[11] Patent Number: 6,162,686
[45] Date of Patent: Dec. 19, 2000

[54] METHOD FOR FORMING A FUSE IN INTEGRATED CIRCUIT APPLICATION

[75] Inventors: Kuo Ching Huang, Kaohsiung; Tse-Liang Ying, Hsin-Chu; Yu-Hua Lee; Ming-Hsin Li, both of Hsinchu, all of Taiwan

[73] Assignee: Taiwan Semiconductor Manufacturing Company, Hsin-Chu, Taiwan

[21] Appl. No.: 09/156,362

[22] Filed: Sep. 18, 1998

[51] Int. Cl.[7] .......................... H01L 21/336; H01L 21/82; H01L 21/331; H01L 21/44; H01L 21/00
[52] U.S. Cl. .......................... 438/281; 438/132; 438/333; 438/601; 257/503; 257/506
[58] Field of Search ..................................... 438/132, 215, 438/281, 333, 601, 714, 738, 421, 424, 614; 257/452, 503, 506, 508, 513, 518

[56] References Cited

U.S. PATENT DOCUMENTS

| | | | |
|---|---|---|---|
| 5,212,102 | 5/1993 | Iranmanesh et al. | 437/31 |
| 5,244,836 | 9/1993 | Lim | 437/192 |
| 5,427,979 | 6/1995 | Chang | 437/190 |
| 5,472,901 | 12/1995 | Kapoor | 437/60 |
| 5,538,924 | 7/1996 | Chen | 437/246 |
| 5,573,970 | 11/1996 | Pramanik et al. | 437/60 |
| 5,618,750 | 4/1997 | Fukuhara et al. | 438/601 |
| 5,702,982 | 12/1997 | Lee et al. | 438/260 |
| 5,879,982 | 3/1999 | Park et al. | 438/241 |
| 5,907,788 | 4/1999 | Kasai | 438/622 |
| 5,953,635 | 9/1999 | Andideh | 438/761 |
| 5,970,346 | 10/1999 | Liaw | 438/281 |
| 5,989,784 | 11/1999 | Lee et al. | 430/316 |
| 6,027,999 | 2/2000 | Wong | 438/637 |
| 6,078,088 | 1/2000 | Buynoski | 257/410 |

*Primary Examiner*—Trung Dang
*Assistant Examiner*—Brook Kebede
*Attorney, Agent, or Firm*—George O. Saile; Stephen B. Ackerman; William J. Stoffel

[57] ABSTRACT

A method of forming a grooved fuse (plug fuse) in the same step that via plugs are formed in the guard ring area 14 and in product device areas. A key point of the invention is to form fuses from the via plug layer, not from the metal layers. Also, key guard rings are formed around the plug guise. The invention can include the following: a semiconductor structure is provided having a fuse area, a guard ring area surrounding the fuse area; and a device area. First and second conductive strips are formed. First and second insulating layers are formed over the first and second conductive strips. Plug contacts and fuse plugs are formed through the first and second insulating layers to the first and second conductive strips. A third insulating layer is formed over the second insulating layer. Metal lines are formed over the third insulating layer in the device area. A fuse via opening is formed in the third insulating layer. A plug fuse is formed in the fuse via opening. A fourth insulating layer is formed over the plug fuse and the third insulating layer. A fuse opening is formed at least partially though the fourth insulating layer over the fuse area.

12 Claims, 6 Drawing Sheets

METHOD FOR FORMING A FUSE IN INTEGRATED CIRCUIT APPLICATION

BACKGROUND OF INVENTION

1) Field of the Invention

This invention relates generally to fabrication of fuses in an integrated circuit structure. More particularly this invention relates to the formation of a fuse formed simultaneously with metal plugs of an interconnect structure and a guard ring structure.

2) Description of the Prior Art

Increasing metal levels for complex/powerful circuit functions are required for future semiconductor device designs. But it makes the redundancy technology of poly fuse by laser repairing very difficult due to too many oxides layers covering the fuse. Replacing the poly fuses with metal fuses is the simplest approach to overall overcome this barrier. Metal fuses with laser cuts would be preferred by industry but there are problems with fuse reliability. The inventors have found that metal corrosion, especially with fuses formed of Al, is a major issue for metal fuses with the same passivation scheme. Also it is difficult to control the thickness of oxide overlying fuses so to adequately cut the fuse with a laser.

Figure 8:
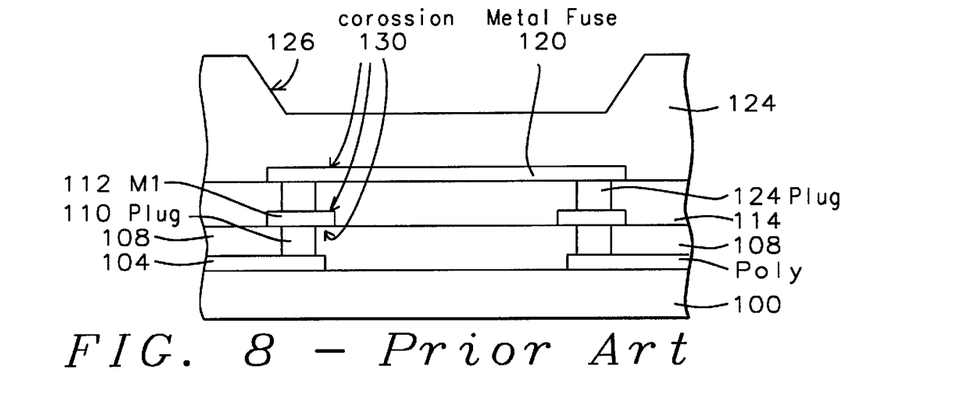
FIG. 8 is a cross sectional view of a fuse formed by the prior art.

FIG. 8 shows a cross section view of a conventional metal fuse 120. Polysilicon lines 104 are formed over a substrate 100 including a field oxide region. An interlevel dielectric (ILD) layer 108 is formed over the poly lines 104. Contact openings are formed in the IDL layer 108 and a first plug 110 is formed contacting the poly lines 104. Next a first metal layer 112 (M1) is formed over the first plug 110. The metal layer also is formed in device areas comprising metal lines (M1). Next, a first inter metal dielectric (MID) layer 114 having first via opening is formed. The via openings are filled with a second plug 124. Next, a metal fuse 120 is formed over the first inter metal dielectric (M0) layer and metal lines (M2) are simultaneous formed in device areas. The metal lines (M2) and the metal fuse are often formed of aluminum alloys or Al-Cu alloys. Next, insulating and passivation layers 124 are formed thereover. A fuse opening 126 is etched in the insulating and passivation layers 124.

The inventor has found a major corrosion problem 130 with this metal fuse 120 and the interconnect structure having the metal layer (e.g., 112) and plugs 108 124. The inventors have found corrosion 130 where the metals 112 120 contact the plugs 108, 124. It is the intent this patent to overcome this corrosion 130 problem.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,472,901 (Kapoor) shows a process for making a metal fuse.

U.S. Pat. No. 5,618,750 (Fakuhara) shows a fuse structure with the fuse formed from the conventional metal layers.

U.S. Pat No. 5,573,970 (Pramanik) shows a method of forming an anti-fuse using a W-plug.

U.S. Pat. No. 5,538,924 (Chen) shows a fuse with guard ring. U.S. Pat No. 5,512,102 (Iranmanesh et al) shows a metal vertical fuse. U.S. Pat. No. 5,244,836 (Lim) shows a metal fuse. U.S. Pat. No. 5,427,979 (Chang) shows a multilevel fuse using plugs.

U.S. Pat. No. 5,472,901 (Kapoor ) shows another method from forming fuses 86 formed of Via plug metal 80.

SUMMARY OF THE INVENTION

It is an object of the present invention to provide a method for fabricating a fuse from plugs, not from metal layers.

It is an object of the present invention to provide a method for fabricating a fuse from plugmaterial (such as non-corroding material e.g., tungsten (W)), not from metal layers.

It is an object of the present invention to provide a method for fabricating a groove W fuse from W plugs that is surrounded by a guard ring formed of metal lines and plugs.

It is an object of the present invention to fabricate a fuse that as complete immunity to corrosion problems.

The invention is a method of forming a grooved fuse in the same step that via plugs are formed in the guard ring area 14 and in product device areas. The grooved fuse is formed in the same metal deposition step as the plug.

A key point of the invention is to form fuses from the via plug layer, not from the metal layers. Conventional fuses are formed from the metal layers (metal lines that are above and below plugs), not from the via plug metals. A conventional metal interconnect is formed of a 1st metal layer, middle a via plug metal, an overlying 2nd metal. Another feature of the invention is the formation of guard rings around the plug fuse.

The invention (first embodiment) can include the following steps.

a) A semiconductor structure is provided having a fuse area, a guard ring area 14 surrounding the fuse area; and a device area.

b) A first conductive layer is formed over the fuse area. The first conductive layer is comprised of first and second conductive strips.

c) A first insulating layer 24 is formed over the first and second conductive strips.

d) Plug contacts are formed through the first insulating layer 24 to the first and second conductive strips; and device plug contacts are formed in the device area.

e) A second insulating layer is formed over the first insulating layer.

f) Fuse Plug contacts are formed through the second insulating layer to the plug contacts; and device plug contacts (not shown) in the device area.

g) A third insulating layer is formed over the second insulating layer.

h) Metal lines are formed over the third insulating layer in the device area and guard ring area to make a guard ring.

i) A fuse via opening is formed in the third insulating layer over the fuse area.

j) A plug fuse is formed in the fuse via opening using a non-corroding metal.

Simultaneously, plugs of interconnect structures are formed in device areas and in the guard ring.

k) A fourth insulating layer is formed over the plug fuse and the third insulating layer.

l) A fuse opening is formed at least partially though the fourth insulating layer over the fuse area.

A guard ring is formed using the same metal deposition steps used to form the fuse and other metal deposition steps (not described) used to form product devices.

A second embodiment of the invention forms the guard ring only from plug material.

Key features of the invention are to: form the fuse from plug material, form the fuse in a higher oxide layer (above the FOX or STI) and, simultaneously form a guard ring.

The reference numbers in the above summary do not limit the scope of the invention, but are shown to aid in the understanding of the invention and the show only an example of an implementation of the invention. Other configurations of insulating layers and conductive layers are possible.

Benefits

The invention provides the following benefits:

The fuse is formed of W material that prevents the fuse form suffering from corrosion problems The W fuse material has a high absorbing coefficient for laser beam.

The grooved W fuse won't splash as it is burnt by a laser. See FIG. 7C.

Good control of remaining oxide thickness on grooved W fuse during fuse window etching process.

No substrate damage after laser repair due to thicker oxide under W fuse.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

The present invention will be described in detail with reference to the accompanying drawings. The present invention provides a method of forming a W fuse in a groove using plug material and for forming a surrounding guard ring.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not be described in detail in order to not unnecessarily obscure the present invention.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

The invention provides a method of fabricating of a fuse formed of a plug 58A. This contrast with the prior art process of forming the fuse with metal layers. The plug is the material that connects two metal layers (or two conductive layer). Plugs and the invention's plug fuse 58A are commonly formed of W, but can be formed of other materials.

The nomenclature used in this patent is the same as used in industry. Metal layers (e.g., M1, M2, M3 etc) formed in product areas, are formed on dielectric layers and form lines that connect devices together. Plugs are metals that connect between two metal lines or between two conductive lines on different levels. A typical interconnect formation is a lower Metal line layer, a Plug, and a higher metal line layer. It is important to understand that the plug layer is not normally a line that connects between elements on the same level. The plug normally connects conductive lines separated vertically by an ILD or IMD) layer.

Figure 1:
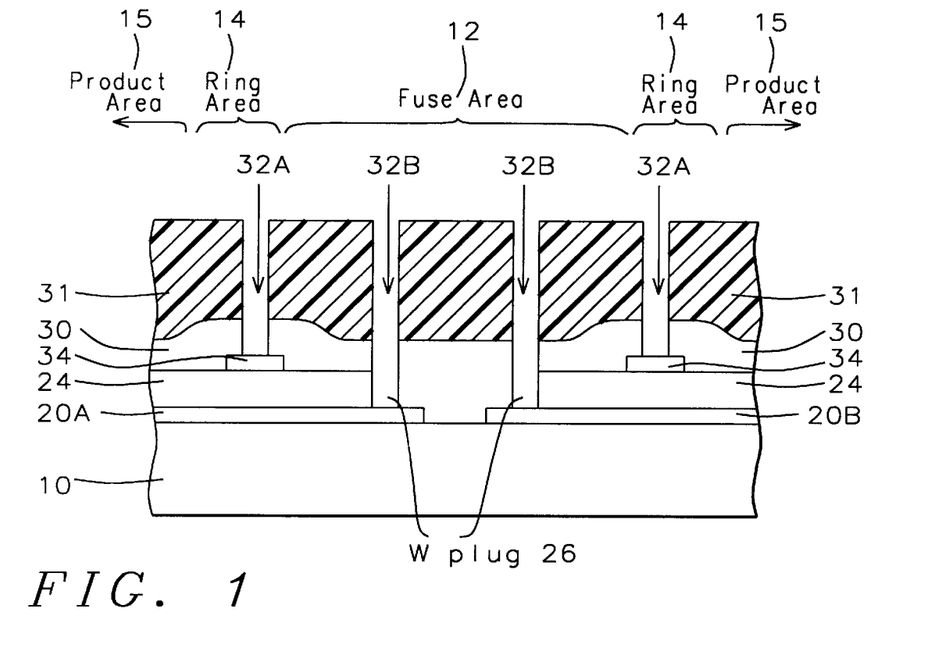
FIGS. 1 through 5 are cross sectional views for illustrating a method for manufacturing a fuse using via plug material and a surrounding guard ring according to the present invention.
Figure 2:
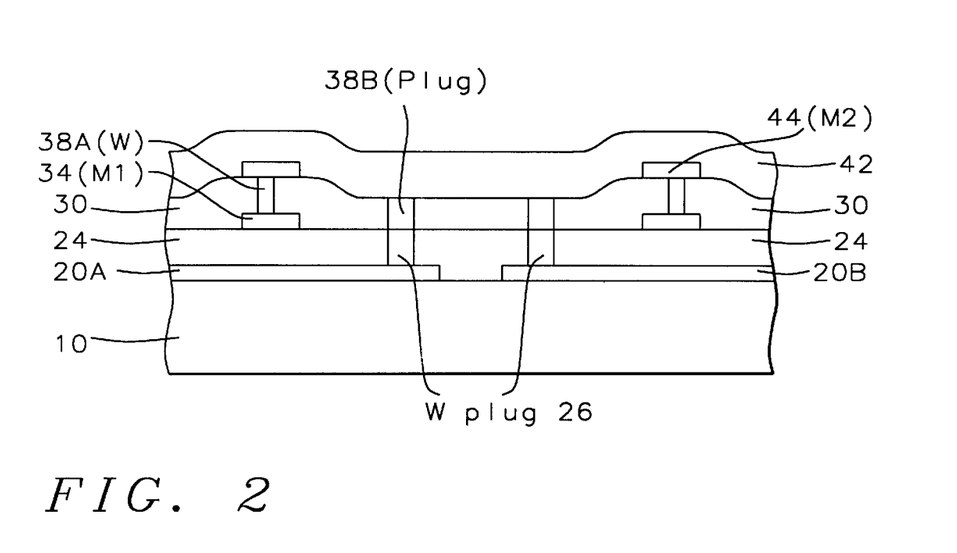
Figure 4:
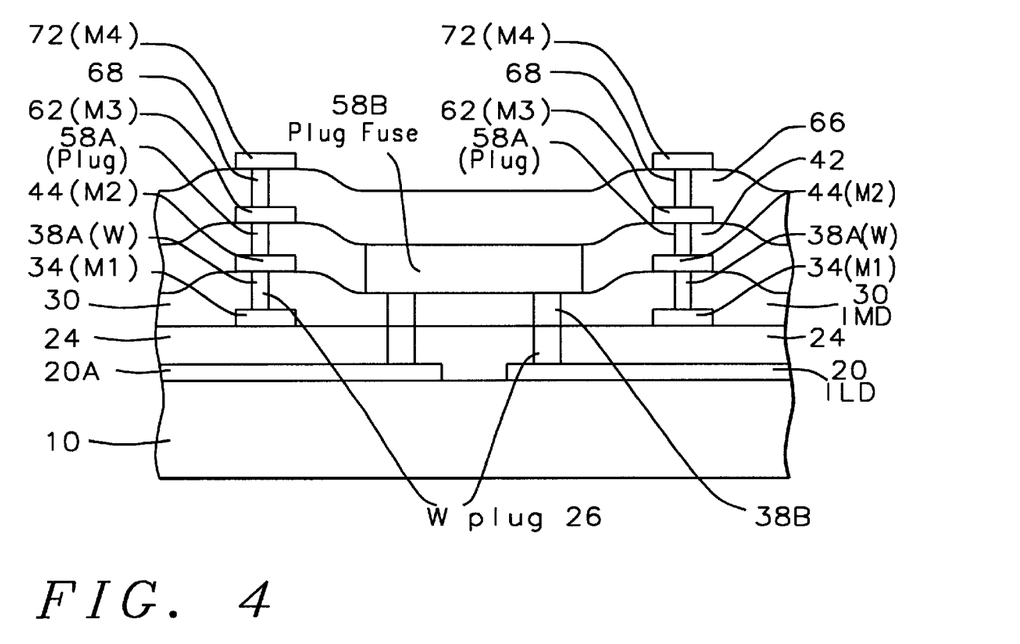
Figure 5:
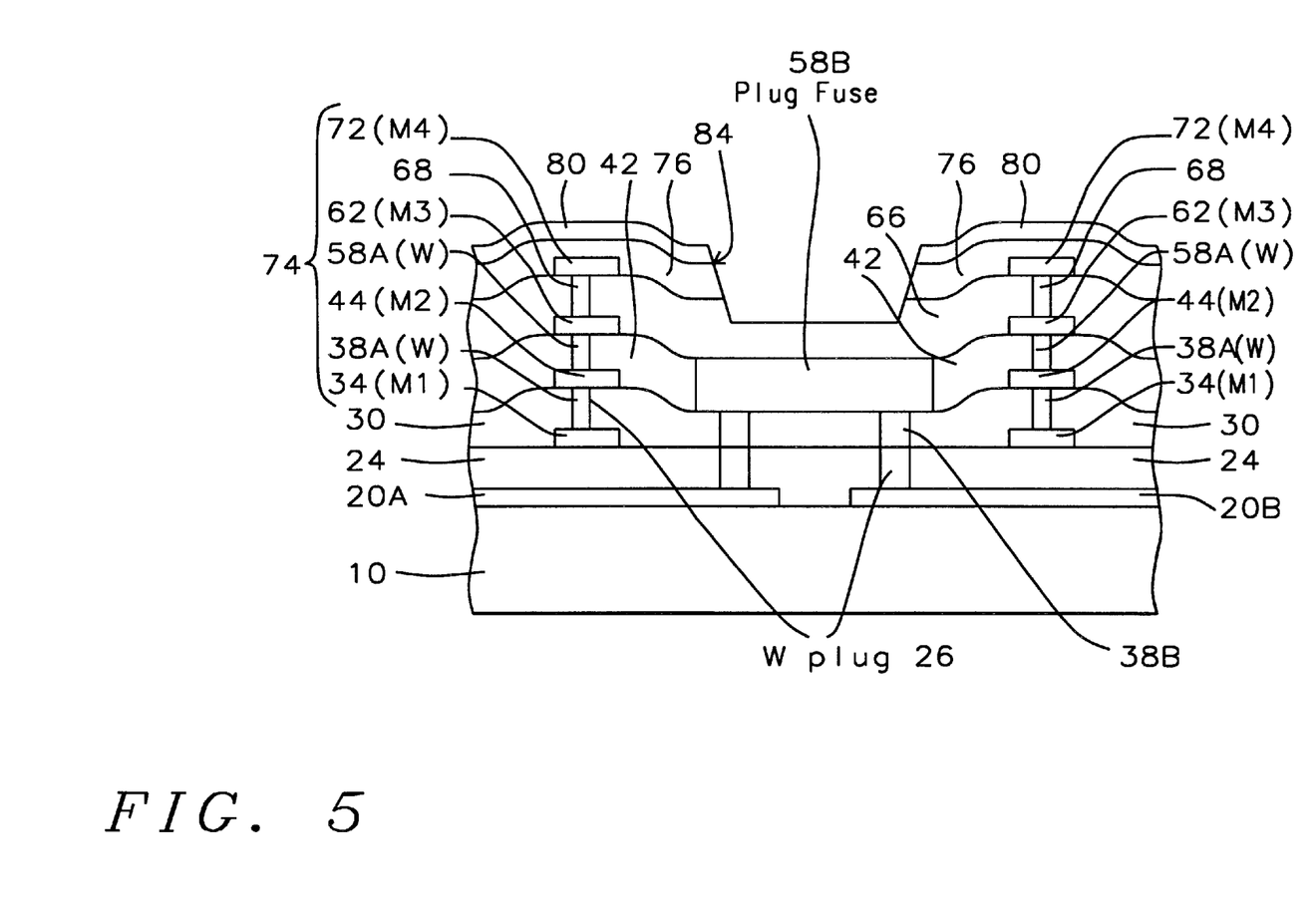
Figure 6:
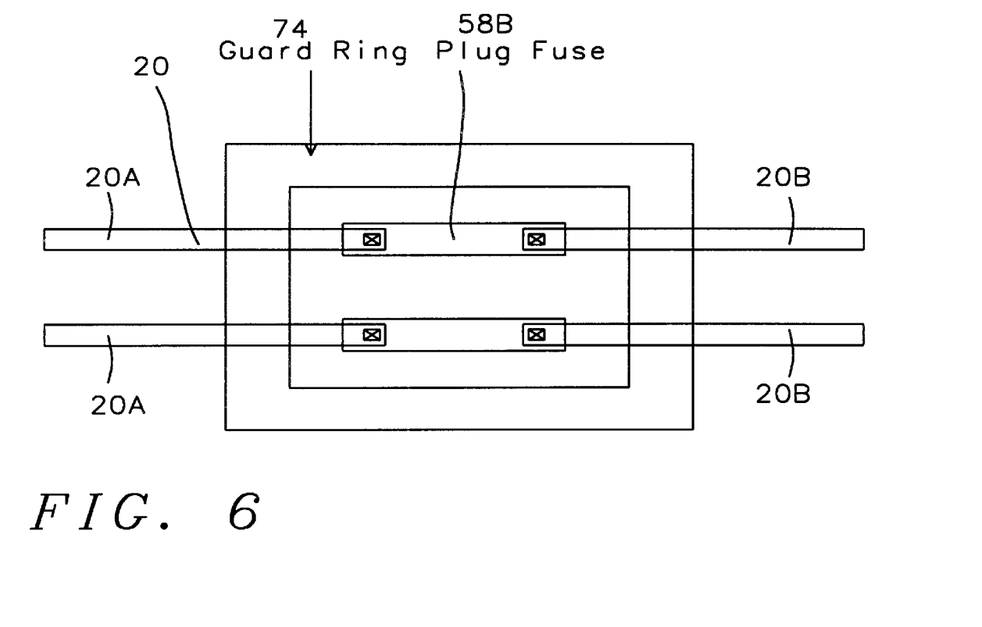
FIG. 6 is a top down view of the plug fuse 58B and the guard ring of the according to the present invention.

An overview of the major steps of the invention in a preferred configuration are shown below: (refer back to FIG. I for the elements 12, 14 and 15)

a) (See FIG. 1) provide a semiconductor structure having a fuse area 12, a guard ring area 14 surrounding the fuse area 12, and a device area 15;

b) form a first conductive layer over fuse area 12 in a semiconductor structure 10; the first conductive layer comprised of first and second conductive strips 20A 20B;

c) form a ILD layer (first insulating layer) 24 over the first and second conductive strips 20A 20B;

d) form first contact openings (not shown) in the ILD layer exposing portions of the first and second conductive strips 20A 20B in the fuse area 12;

e) form a fuse contact plug 26 in the first contact openings contacting the first and second conductive strips 20A 20B; and simultaneously form device contacts (not shown) in the device area;

f) form a first metal ring 34 in the guard ring area on the interlevel dielectric (ILD) layer surrounding the fuse area 12;

g) form a first inter metal dielectric (MMD) layer (second insulating layer) 30 over the contact plug 26 and the first metal ring 34;

h) (FIG. 1) form first via ring openings 32A in the first IME) layer exposing the first metal ring 34 and forming first via fuse openings 32B exposing the contact plugs 26 in the fuse area 12;

i) (See FIG. 2) form first plug rings 38A in the first via ring openings 32A and forming first fuse plugs 38B in the first via fuse openings 32B;

j) (See FIG. 2)—form a second metal ring 44 on the first plug rings 38A;

k) form a second IMD layer 42 over the first IMD layer 30, the second metal ring 44 and the first fuse plugs 38B;

l) (see FIG. 3)—forming a second via ring opening 54A over the second metal ring 44 through the second IMD layer 42 and forming a fuse opening 54B over the fuse area 12 (See FIG. 1) exposing the first fuse plugs 38B;

m) (See FIGS. 3 and 4 )—form a second plug ring 58A in the second via ring opening 54 and forming a plug fuse 58B in the fuse opening 54B contacting the first fuse plugs 38B; the plug fuse 58B electrically connected to first and second conductive strips;

n) form a third metal ring 62 on the second plug ring 58A;

o) form a third IMD layer 66 over the second IMD layer 42;

p) form third via ring openings over the third metal ring 62;

q) form a third plug ring 68 in the third via openings contacting the third metal ring 62;

r) form a fourth metal ring 72 on the third IME layer 66 contacting the third plug ring 68;

s) (See FIG. 5)—form a passivation layer 76 80 over the third IMD layer;

FIG. 5—form a fuse widow at least partially through the passivation layer 76 80 and the third IMD layer 66.

The invention is described in more detail as follows. As shown in FIG. 1, a semiconductor structure having a fuse area 12, a guard ring area (e.g., fuse ring area) 14 surrounding the fuse area 12; and a device area 15 is provided. These areas 12 14 and 15 are in all FIGS but only shown once in FIG. 1. Refer to FIG. 1 for these areas 12 14 15. The product device area 15 surrounds the fuse ring area 14. The product device area is were FETs and other devices and metal and insulating layers are made.

A substrate is provided. Substrate 10 is understood to possibly include a semiconductor wafer, active and passive devices formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

A first conductive layer preferably comprised of polysilicon is formed over fuse area 12 in a semiconductor structure 10. The polysilicon layer is comprised of first and second conductive strips 20A 20B. These strips provide the electrically signal through the fuse 58B. See FIG. 4. The first and second strips 20A 20B are typically formed on an isolation region such as a FOX or STI oxide region.

Next, an interlevel dielectric (ELD) layer (first insulating layer) 24 is formed over the first and second conductive strips 20A 20B. The ILD layer is preferably composed of silicon oxide.

Contact openings (not shown) are formed in the interlevel dielectric (ILD) layer exposing portions of the first and second conductive strips 20A 20B in the fuse area 12.

Subsequently, fuse contact plugs 26 are formed in the first contact openings contacting the first and second conductive strips 20A 20B.

The contact plug 26 can be composed of W and may comprise any metal conventionally used in plug (via) formation including W, titanium tungsten, and titanium. The contact plug (and all plug discussed in the invention) are most preferably formed of W or a W alloy.

The plugs are preferably formed using (a) A damascene process, (b) selective W chemical vapor deposition (CVD) or (c) blanket chemical vapor deposition and then CMP or etch back.

The plug materials are very resistant to corrosion or do not corrode. This is an important distinction between plug materials and metal line materials (such as Al-alloys).

A first IMD layer (second insulating layer) 30 is formed over the contact plug 26 and the interlevel dielectric (ELD) layer 24 over the entire substrate.

A first metal layer is formed over the resultant surface and then patterned. A first metal ring 34 is formed in the guard ring area on the interlevel dielectric (ILD) layer surrounding the fuse area 12. The first metal ring layer is formed during the same step that a first metal layer or line (m1) is formed in product device areas on other areas of the chip. Likewise for the other metal ring layers in the invention (34 44 62 etc) (See FIG. 5), product metal layer are simultaneous formed in product areas (not shown).

The first metal layer is preferably composed of Al, or Al-Cu alloys or Cu-alloys. The first metal layer and all metal layer discussed in this patent are preferably composed of an Al-Cu alloy.

The metal layer can have barrier layers and adhesion layers that are not shown in the figures.

Referring to FIG. 1, first via ring openings 32A in the interlevel dielectric (ILD) layer 24 and second insulting layer (IMD-1) 30 are formed exposing the first metal ring 34; and first via fuse openings 32B are formed exposing the contact plugs 26 in the fuse area 12.

FIG. 2 shows forming first plug rings 38A in the first via ring openings 32A and forming first fuse plugs 38B in the first via fuse openings 32B and simultaneously forming plugs over the metal lines and interconnects in the product device areas. The plugs can be formed of the same materials described above. The plugs are preferably formed of W.

A second metal ring 44 is formed on the first plug rings 38A and 2nd metal is formed in device areas.

A third insulating layer (e.g., second inter metal dielectric (IMD-2) layer) 42 is then formed over the second metal ring 44 and the first fuse plugs 38B and over the entire substrate.

Figure 3:
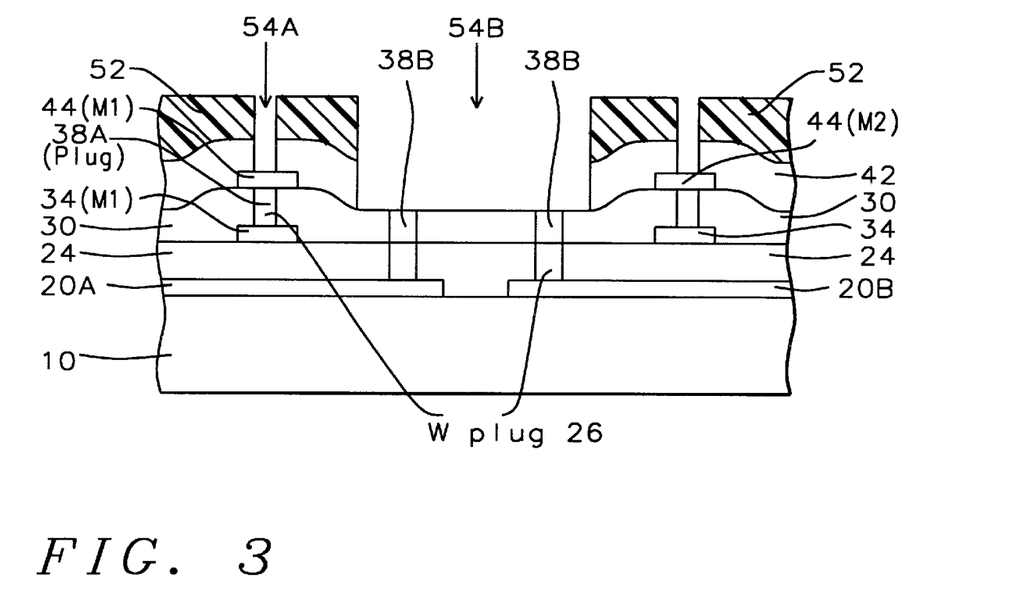

FIG. 3 shows the step of forming a second via ring opening 54A over the second metal ring 44 through the third insulating layer (second IMDm layer) 42 and forming a fuse opening 54B over the fuse area 12 exposing the first fuse plugs 38B.

FIG. 4 illustrates forming a second plug ring 58A in the second via ring opening 54 and forming a plug fuse (grooved fuse) 58B in the fuse opening 54B contacting the first fuse plugs 38B. The plug fuse 58B is electrically connected to first and second conductive strips.

Figure 7A:
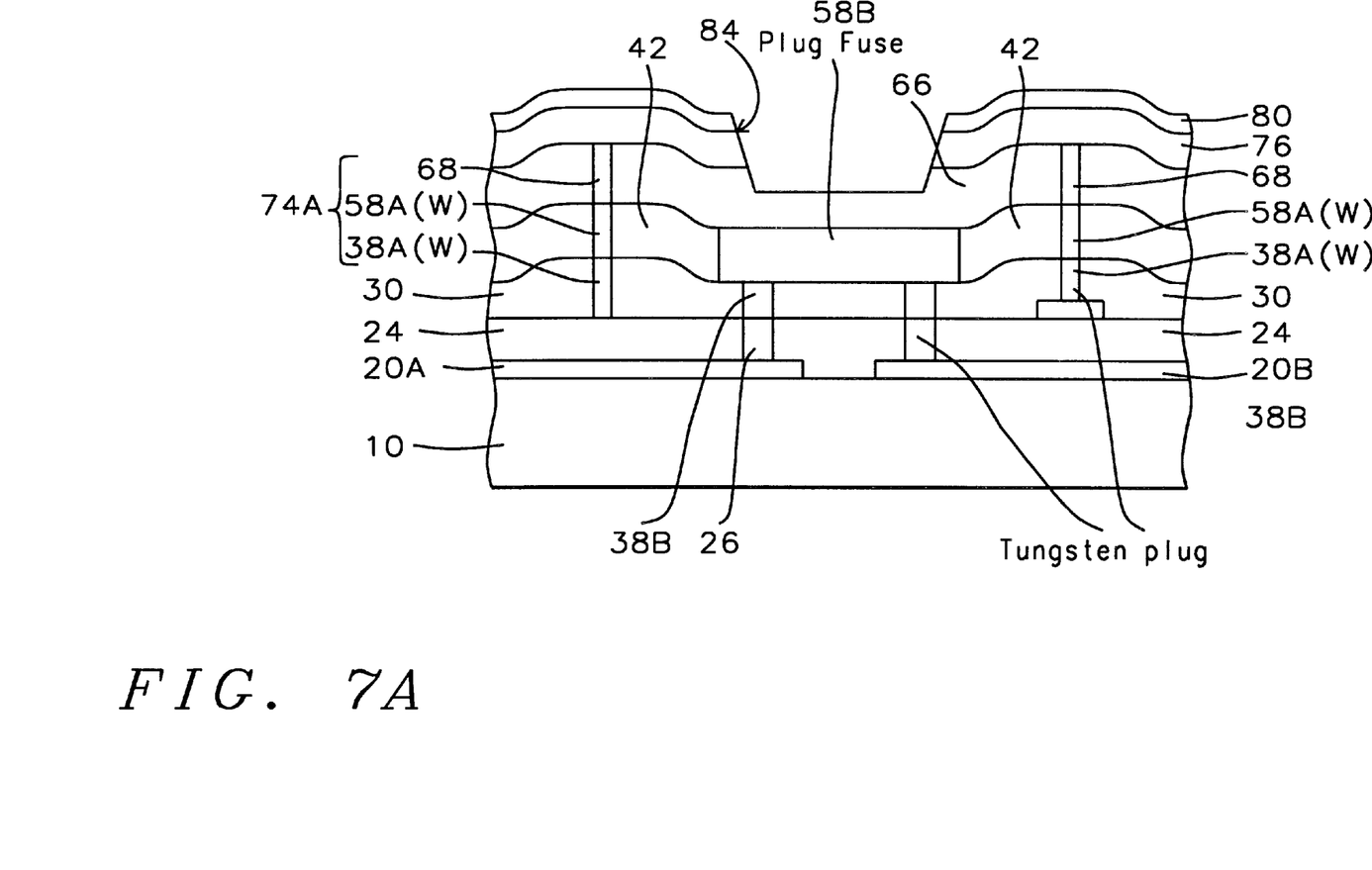
FIG. 7A is a cross sectional view illustrating a second embodiment of the method for manufacturing a fuse using via plug material and a surrounding guard ring using only plugs according to the present invention.
Figure 7B:
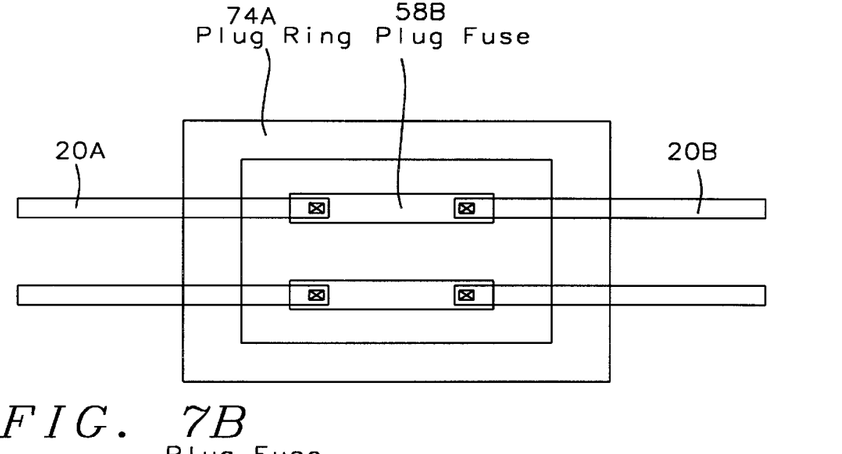
FIG. 7B is a top down view of the plug fuse 58B and the guard ring of the according to the $2^{nd}$ embodiment of the present invention.
Figure 7C:
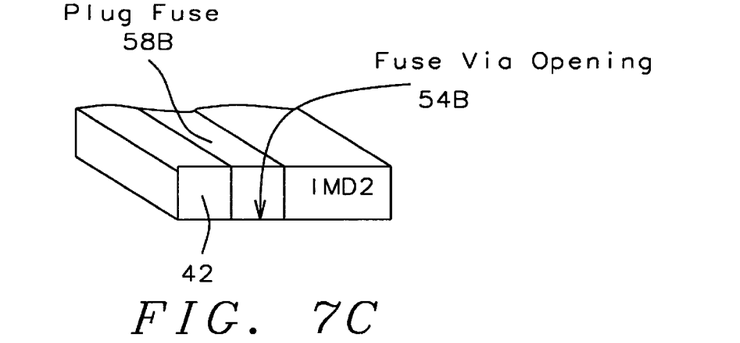
FIG. 7C is a three dimensional view of the invention's plug fuse (grooved fuse) 58B showing that a groove is etched in the insulating layer and then filled with the metal for the plug fuse.

As shown in FIG. 7C, an important feature of the invention is the process to form the "grooved fuse" 58B. A photoresist pattern is formed with openings for the fuse and vias. A groove is etched in the third insulating layer (e.g., second IMD layer). The photoresist layer is then removed. The groove is then filled with the metal for the groove fuse (plug fuse 58B).

Referring to FIG. 4, the plug fuse 58B is formed of plug materials preferably composed of W, and may comprise any metal conventionally used in plug (via) formation that do not corrode. The plug fuse is preferably composed of W, titanium tungsten, or titanium, and most preferably composed of a W alloy. It is an important point that the plug materials above do not corrode. A damascene process can be used to form the plugs.

A third metal ring 62 is then formed on the second plug ring 58A and simultaneously a third metal layer (M3) is formed in the product areas. .

A fourth insulating layer (third If layer) 66 is formed over the second IMD layer 42 and the entire wafer.

Third via ring openings are formed over the third metal ring 62 and product via openings are formed in the product areas.

A third plug ring 68 is formed in the third via openings contacting the third metal ring 62 and third level product plugs are formed in the product areas.

Next, a fourth metal ring 72 is formed on the third IMD layer 66 contacting the third plug ring 68 and product 4th level metal lines are formed in the product areas.

Referring to FIG. 5, a passivation layer 76 80 is formed over the third IMD layer. The passivation can comprise a multi-layer structure. The passivation layer is preferably composed of a two layer structure 76 80 comprised of a lower silicon nitride ($Si_3N_4$) layer and an overlying spin-on-glass (SOG) layer 80. Other layers and materials are possible.

Next, a fuse widow 84 is formed at least partially through the passivation layer 76 80 and the third IMD layer 66. Because the depth of the fuse window 54B is shallower than that of a conventional fuse window, the remaining oxide thickness on grooved W fuse during fuse window etching process is easy to control.

The above descriptions shows the plug fuse 58A formed in the 3 plug layer second If layer 42 but is obvious that the plug fuse can be formed on any plug layer (e.g., 38A 58A, 68). The invention's grooved W fuse can be formed of Via-1 plug, Via-2 plug . . . or Via-N (where N=number of metal layers −2). Moreover, different numbers and configurations of insulating layers, metal layers and plug layers can be used with the invention. The key features of the invention are to: form the fuse 38B from plug material, form the fuse 37B in a higher oxide layer (above the FOX or STI) and, simultaneously form a guard ring 74 or 74A.

FIGS. 7A and 7B, show another embodiment of the invention where the guard rings 74A is formed from only plugs (e.g., 38A 58A 68 ).

Benefits of Invention

The plug fuse 58B of the invention and guard ring 38A 44 58A 62 68 72 74 provide the following benefits:

The plug fuse 58B is preferably formed of W material that prevents the fuse form suffering from corrosion problems.

The W fuse 58B material has a high absorbing coefficient for laser beam.

The grooved W fuse 58B won't splash as it is burnt by a laser.

Better control to remaining oxide thickness on grooved W fuse during fuse window etching process.

No substrate damage after laser repair due to thicker oxide (e.g., 24 30) under W fuse 58B.

While the invention has been particularly shown and described with reference to the preferred embodiments thereof, it will be understood by those skilled in the art that various changes in form and details may be made without departing from the spirit and scope of the invention.

What is claimed is:

1. A method of fabricating of a grooved fuse comprised of a plug layer comprising the steps of:
   a) providing a semiconductor structure having a fuse area, and a device area;
   b) forming a first conductive layer over said fuse area; said first conductive layer comprised of first and second conductive strips;
   c) forming a plurality of insulating layers having (a) fuse plug contacts to said first and second conductive strips, and (b) device plugs in said device area; said fuse plug contacts electrically connected to said first and second conductive strips; said fuse plug contacts composed of a non-corroding material;
   d) forming a dielectric layer over said plurality of insulating layers and fuse plug contacts;
   e) etching a fuse via opening in said dielectric layer;
   f) forming a plug fuse in said fuse via opening and simultaneously forming plugs in said device area; said plug fuse is electrically connected to said fuse plug contacts;
   g) forming a plurality of passivation layers, metal layers and plugs, over said plug fuse and said dielectric layer to form device interconnects in said device area.

2. A method of fabricating of a grooved fuse comprised of a plug layer comprising the steps of:
   a) providing a semiconductor structure having a fuse area, a guard ring area surrounding said fuse area; and a device area;
   b) forming a first conductive layer over said fuse area; said first conductive layer comprised of first and second conductive strips;
   c) forming a plurality of insulating layers having (a) fuse plug contacts to said first and second conductive strips, (b) device plugs in said device area and (c) ring plugs in said guard ring area; said fuse plug contacts electrically connected to said first and second conductive strips; said fuse plug contacts composed of a non-corroding material;
   d) forming a dielectric layer over said plurality of insulating layers and fuse plug contacts;
   e) etching a fuse via opening in said dielectric layer;
   f) forming a plug fuse in said fuse via opening and simultaneously forming plugs in said device area; said plug fuse is electrically connected to said fuse plug contacts;
   g) forming a plurality of passivation layers, metal layers and plugs, over said plug fuse and said dielectric layer to form device interconnects in said device area, a guard ring comprised of said ring plugs.

3. The method of claim 2 which further includes simultaneously forming a guard ring in said guard ring area using only said plugs and ring plugs formed from non-corroding material.

4. The method of claim 2 which further includes simultaneously forming a guard ring in said guard ring area using only plugs formed from tungsten.

5. The method of claim 2 which further includes simultaneously forming a guard ring in said guard ring area; said guard ring formed of plugs and metal layers.

6. A method of fabricating of a grooved fuse comprised of a plug material comprising the steps of:
   a) providing a semiconductor structure having a fuse area, a guard ring area surrounding said fuse area; and a device area;
   b) forming a first conductive layer over said fuse area; said first conductive layer comprised of first and second conductive strips;
   c) forming a first insulating layer over said first and second conductive strips;
   d) forming a second insulating layer over said first insulating layer;

e) forming plug contacts through an overlying first and second insulating layers to said first and second conductive strips; and forming device plug contacts in said device area;

f) forming a third insulating layer over said second insulating layer;

g) forming metal lines over said third insulating layer in said device area;

h) forming a fuse via opening in said third insulating layer and i) forming a plug fuse in said fuse via opening;

j) forming a fourth insulating layer over said plug fuse and said third insulating layer; and k) forming a fuse opening at least partially though said fourth insulating layer over said fuse area.

7. The method of claim 6 wherein said first conductive layer is comprised of polysilicon.

8. The method of claim 6 wherein said plug fuse composed of a material selected from the group consisting of tungsten, tungsten -alloys, titanium tungsten, and titanium.

9. A method of fabricating of a plug fuse comprised of plug metal and forming a guard ring around said plug fuse, comprising the steps of:

a) providing a semiconductor structure having a fuse area, a guard ring area surrounding said fuse area, and a device area;

b) forming a first conductive layer over fuse area in a semiconductor structure; said first conductive layer comprised of first and second conductive strips;

c) forming a interlevel dielectric layer over said first and second conductive strips;

d) forming first contact openings in said interlevel dielectric layer exposing portions of said first and second conductive strips in said fuse area;

e) forming a fuse contact plug in said first contact openings contacting said first and second conductive strips;

f) forming a first metal ring in said guard ring area on said interlevel dielectric layer surrounding said fuse area;

g) forming a first inter metal dielectric layer over said contact plug and said interlevel dielectric layer;

h) forming first via ring openings in said first inter metal dielectric layer exposing said first metal ring and forming first via fuse openings exposing said contact plugs in said fuse area;

i) forming first plug rings in said first via ring openings and forming first fuse plugs in said first via fuse openings;

j) forming a second metal ring on said first plug rings;

k) forming a second inter metal dielectric layer over said first inter metal dielectric layer, said second metal ring and said first fuse plugs;

l) forming a second via ring opening over said second metal ring through said second inter metal dielectric layer and forming a fuse opening over said fuse area exposing said first fuse plugs;

m) forming a second plug ring in said second via ring opening and forming a plug fuse in said fuse opening contacting said first fuse plugs; said plug fuse electrically connected to first and second conductive strips;

n) forming a third metal ring on said second plug ring;

o) forming a third inter metal dielectric layer over said second inter metal dielectric layer;

p) forming third via ring openings over said third metal ring;

q) forming a third plug ring in said third via openings contacting said third metal ring;

r) forming a fourth metal ring on said third inter metal dielectric layer contacting said third plug ring;

s) forming a passivation layer over said third inter metal dielectric layer;

t) forming a fuse widow at least partially through said passivation layer and said third inter metal dielectric layer.

10. The method of claim 9 wherein said first conductive layer comprised of polysilicon.

11. The method of claim 9 wherein said contact plug composed of a material selected from the group consisting of tungsten, titanium tungsten, and titanium.

12. The method of claim 9 wherein said plug fuse is formed of plug materials composed of a material selected from the group consisting of tungsten, titanium tungsten, and titanium.

* * * * *